(12) United States Patent
Takahashi et al.

(10) Patent No.: US 8,766,103 B2
(45) Date of Patent: Jul. 1, 2014

(54) ELECTRONIC COMPONENT

(75) Inventors: Takeo Takahashi, Yokohama (JP); Xiaoyu Mi, Kawasaki (JP); Tsuyoshi Yokoyama, Kawasaki (JP); Tokihiro Nishihara, Kawasaki (JP); Satoshi Ueda, Kawasaki (JP)

(73) Assignees: Taiyo Yuden Co., Ltd., Tokyo (JP); Fujitsu Limited, Kawasaki (JP)

( * ) Notice: Subject to any disclaimer, the term of this patent is extended or adjusted under 35 U.S.C. 154(b) by 56 days.

(21) Appl. No.: 12/343,784

(22) Filed: Dec. 24, 2008

(65) Prior Publication Data

US 2009/0166068 A1 Jul. 2, 2009

(30) Foreign Application Priority Data

Dec. 28, 2007 (JP) ................................ 2007-340039

(51) Int. Cl.
*H05K 1/02* (2006.01)
(52) U.S. Cl.
USPC ........................................................ 174/258
(58) Field of Classification Search
USPC .................................. 174/258; 361/321.2, 311
See application file for complete search history.

(56) References Cited

U.S. PATENT DOCUMENTS

| | | | | |
|---|---|---|---|---|
| 5,565,262 | A * | 10/1996 | Azzaro et al. | 428/210 |
| 6,407,343 | B1 * | 6/2002 | Tanaka | 174/261 |
| 6,713,417 | B2 * | 3/2004 | Chikagawa et al. | 501/32 |
| 6,762,369 | B2 * | 7/2004 | Saito et al. | 174/262 |
| 7,326,636 | B2 * | 2/2008 | Liu et al. | 438/612 |
| 7,554,260 | B2 * | 6/2009 | Sakakura et al. | 313/503 |
| 2002/0027018 | A1 | 3/2002 | Chikagawa et al. | |
| 2003/0030985 | A1 * | 2/2003 | Sakai | 361/720 |
| 2003/0107060 | A1 * | 6/2003 | Ota et al. | 257/275 |
| 2006/0131721 | A1 | 6/2006 | Ito | |
| 2007/0052067 | A1 | 3/2007 | Umemoto | |

FOREIGN PATENT DOCUMENTS

| | | |
|---|---|---|
| JP | 10-215074 A | 8/1998 |
| JP | 2004-296854 | 10/2004 |
| JP | 2005-093954 | 4/2005 |
| JP | 2005-302873 | 10/2005 |
| JP | 2007-031242 A | 2/2007 |
| JP | 2007-067216 | 3/2007 |
| JP | 2007-123468 A | 5/2007 |
| JP | 2007-258478 | 10/2007 |
| KR | 1020060071322 A | 6/2006 |
| KR | 10-0682158 B1 | 2/2007 |

OTHER PUBLICATIONS

Japanese Office Action in counterpart Japanese Patent Application 2007-340039 dated Aug. 28, 2012.
Office Action issued in counterpart Japanese Patent Application Serial No. 2007-340039 dated Nov. 13, 2012.

* cited by examiner

*Primary Examiner* — Chau N Nguyen
(74) *Attorney, Agent, or Firm* — Arent Fox LLP

(57) ABSTRACT

An electronic component includes: a multilayer ceramic substrate that has a penetration electrode formed therein, and has a passive element provided on the upper face thereof; an insulating film that is provided on the multilayer ceramic substrate, and has an opening above the penetration electrode; a first connecting terminal that is provided on the insulating film so as to cover the opening, and is electrically connected to the penetration electrode; and a second connecting terminal that is provided on a region of the insulating film other than the opening region.

10 Claims, 17 Drawing Sheets

ELECTRONIC COMPONENT

CROSS-REFERENCE TO RELATED APPLICATION

This application is based upon and claims the benefit of priority of the prior Japanese Patent Application No. 2007-340039, filed on Dec. 28, 2007, the entire contents of which are incorporated herein by reference.

FIELD

The present invention generally relates to an electronic component, and more particularly, to an electronic component that has passive elements placed on a multilayer ceramic substrate.

BACKGROUND

In a case where phase matching and the likes are performed, inductors and capacitors are used. As for RF (Radio Frequency) systems such as portable telephone devices and wireless LANs (Local Area Networks), there are demands for smaller-sized, less costly, and higher-performance systems. To meet those demands, electronic components such as integrated passive devices each having passive elements integrated therein are used.

Integrated passive devices each having passive elements built in a multilayer ceramic substrate have been developed by the LTCC (low temperature co-fired ceramic). Also, integrated passive devices each having passive elements formed on a multilayer ceramic substrate have been developed.

Japanese Patent Application Publication Nos. 2007-123468 and 2007-31242 disclose techniques by which a coating layer is formed on a ceramic substrate, and passive elements are formed on the coating layer.

The integrated passive devices each having passive elements formed on a multilayer ceramic substrate have the following problems. In a case where a chip is to be flip-chip mounted on a multilayer ceramic substrate having passive elements formed on its upper face, the chip is to be located higher than the passive elements. Therefore, connecting terminals taller than the passive elements are formed on the multilayer ceramic substrate, and the chip is then flip-chip mounted onto the connecting terminals. However, the multilayer ceramic substrate has penetration electrodes penetrating through each of the ceramic layers of the multilayer ceramic substrate. The upper faces of the penetration electrodes protrude from the surface of the multilayer ceramic substrate. Therefore, when connecting terminals are formed on the multilayer ceramic substrate, the heights of the connecting terminals vary depending on whether the connecting terminals are located above the penetration electrodes or are located in regions other than the regions corresponding to the penetration electrode. In a case where a chip is to be flip-chip mounted onto the connecting terminals on the multilayer ceramic substrate, reducing the difference in height between the connecting terminals (coplanarity) is important. If the coplanarity is poor, the mounted chip comes off, and breaking is caused between the connecting terminals. Therefore, the connecting terminals are formed in regions other than the regions corresponding to the penetration electrode, so that the connecting terminals have the same heights. As a result, it becomes difficult to form small-sized electronic components.

SUMMARY

It is therefore an object of the present invention to provide an electronic component in which the above disadvantage is eliminated.

A more specific object of the present invention is to provide a smaller-sized electronic component that has passive elements formed on a multilayer ceramic substrate including penetration substrates.

According to an aspect of the present invention, there is provided an electronic component including: a multilayer ceramic substrate that has a penetration electrode formed therein, and has a passive element provided on an upper face thereof; an insulating film that is provided on the multilayer ceramic substrate, and has an opening above the penetration electrode; a first connecting terminal that is provided on the insulating film so as to cover the opening, and is electrically connected to the penetration electrode; and a second connecting terminal that is provided on a region of the insulating film, the region being other than the region corresponding to the opening.

BRIEF DESCRIPTION OF THE DRAWINGS

Other objects, features and advantages of the present invention will become more apparent from the following detailed description when read in conjunction with the accompanying drawings, in which.

DESCRIPTION OF EMBODIMENTS

Figure 1A:
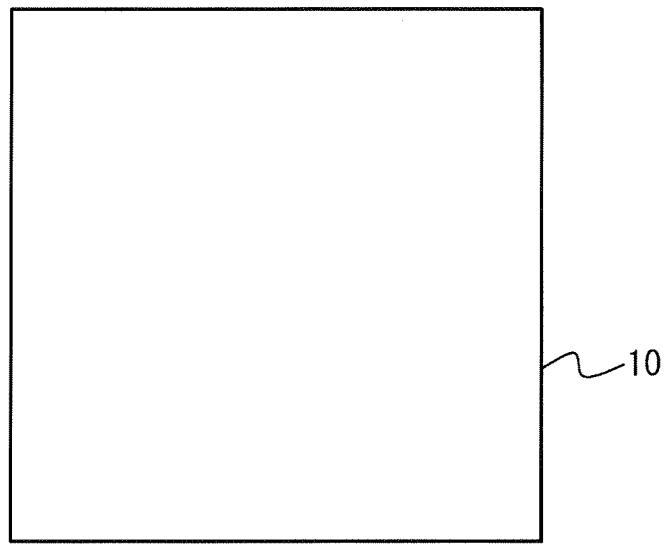
FIGS. 1A and 1B illustrate a method for manufacturing a stack ceramic substrate, FIG. 1A being a top view, FIG. 1B being a cross-sectional view.
Figure 1B:
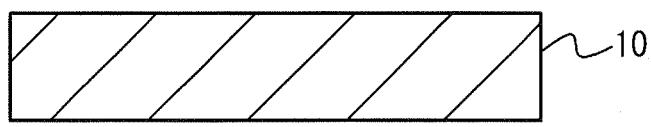
Figure 2A:
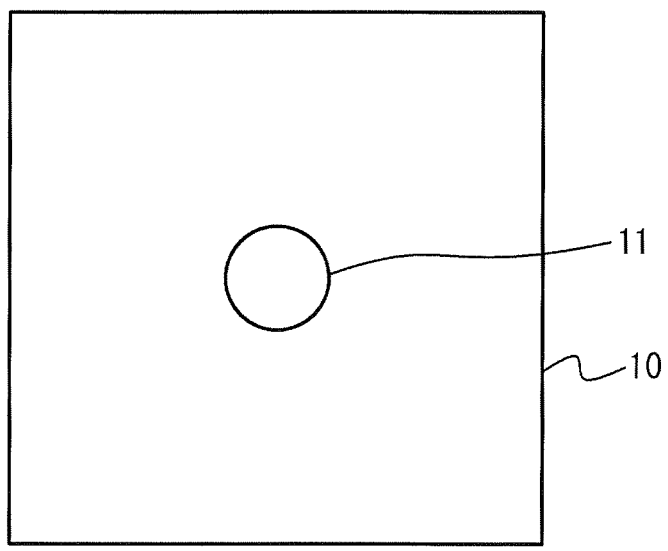
FIGS. 2A and 2B illustrate the method for manufacturing the stack ceramic substrate, FIG. 2A being a top view, FIG. 2B being a cross-sectional view.
Figure 2B:
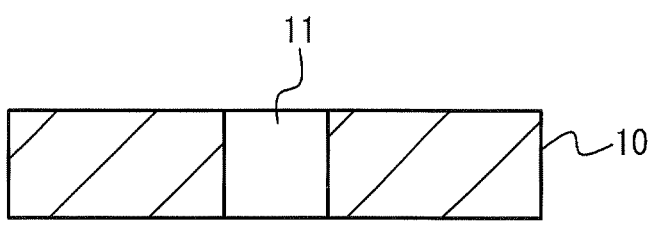
Figure 3A:
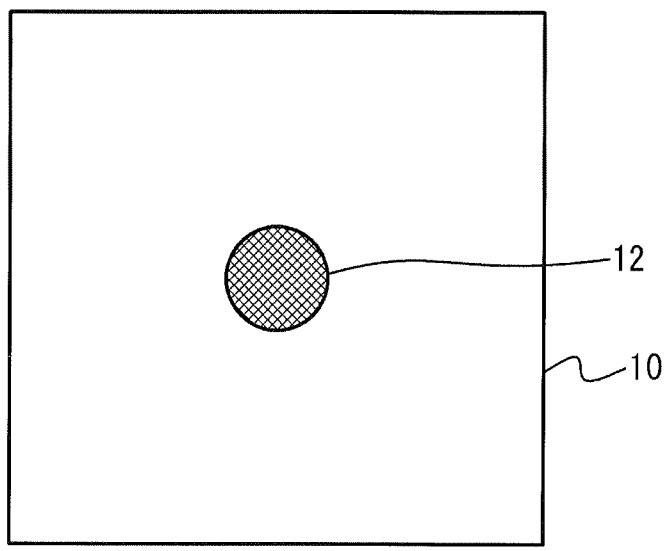
FIGS. 3A and 3B illustrate the method for manufacturing the stack ceramic substrate, FIG. 3A being a top view, FIG. 3B being a cross-sectional view.
Figure 3B:
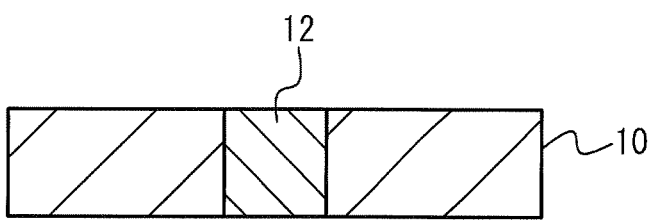
Figure 4A:
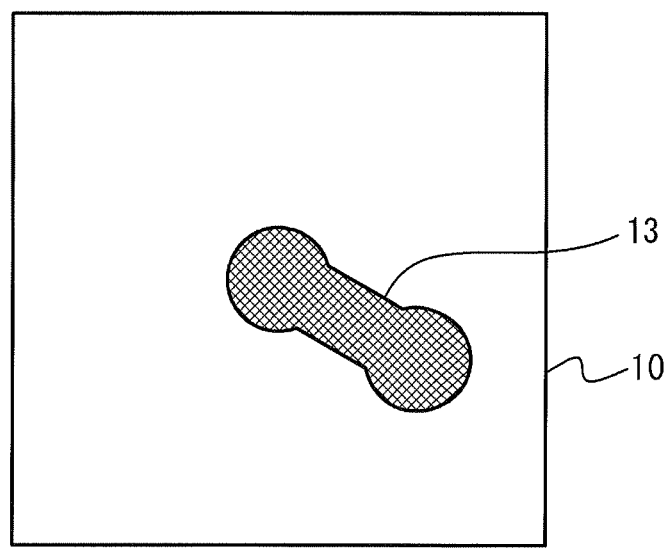
FIGS. 4A and 4B illustrate the method for manufacturing the stack ceramic substrate, FIG. 4A being a top view, FIG. 4B being a cross-sectional view.
Figure 4B:
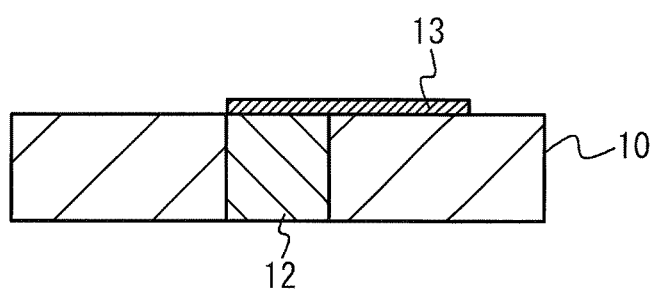
Figure 5A:
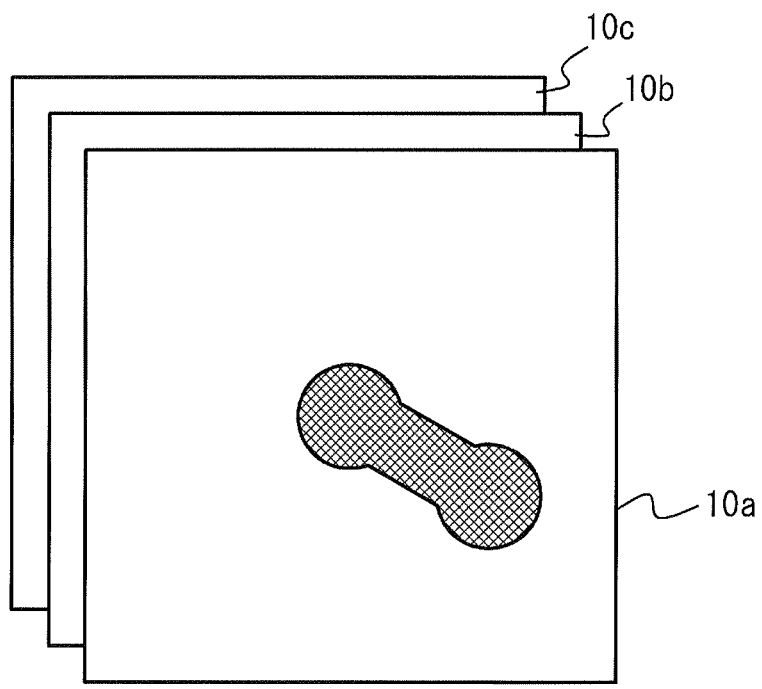
FIGS. 5A and 5B illustrate the method for manufacturing the stack ceramic substrate, FIG. 5A being a top view, FIG. 5B being a cross-sectional view.
Figure 5B:
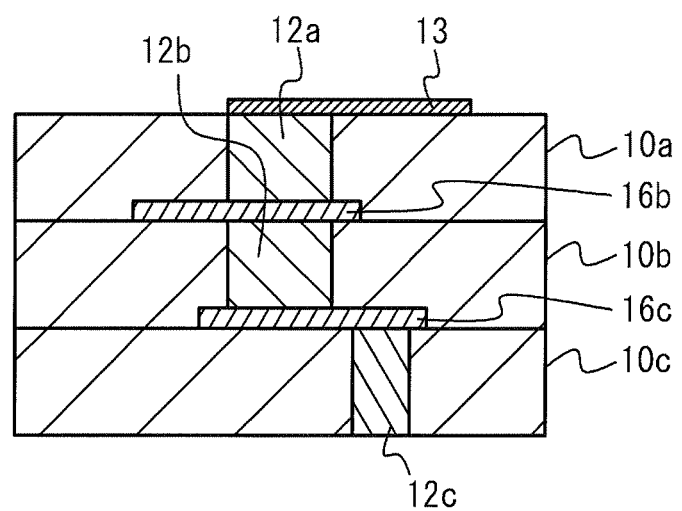

First, the problems to be solved are described in detail. FIGS. 1A through 6 illustrate a method for manufacturing a multilayer ceramic substrate. As shown in FIGS. 1A and 1B, a green sheet is formed with a metal oxide such as alumina ($Al_2O_3$), silicon oxide ($SiO_2$), titanium oxide ($TiO_2$), and calcium oxide (CaO), and the green sheet is cut into a desired shape. As shown in FIGS. 2A and 2B, a through hole 11 is formed in the sheet 10 by a punching technique. As shown in FIGS. 3A and 3B, the through hole 11 is filled with a metal such as Ag, Au, or Cu. In this manner, a penetration electrode 12 is formed. As shown in FIGS. 4A and 4B, printing is performed on the surface of the sheet 10 with a metallic material containing a metal such as Ag, Au, or Cu, so as to form a metal wire 13. As shown in FIGS. 5A and 5B, sheets 10a through 10c formed in the above manner are stacked. For example, the sheet 10a and the sheet 10b are stacked in such a manner that the penetration electrode 12a and the penetration electrode 12b connect to each other, as shown in FIG. 5B. Metal wires to be internal wires 16b and 16c are formed on the sheet 10b and the sheet 10c, respectively. The penetration electrode 12c of the sheet 10c is connected to the penetration electrodes 12a and 12b via the internal wire 16c. The stacked sheets 10a through 10c can be further shaped into a desired form. For example, the stacked sheets 10a through 10c may be shaped into a wafer, so that a passive device can be easily formed later.

Figure 6:
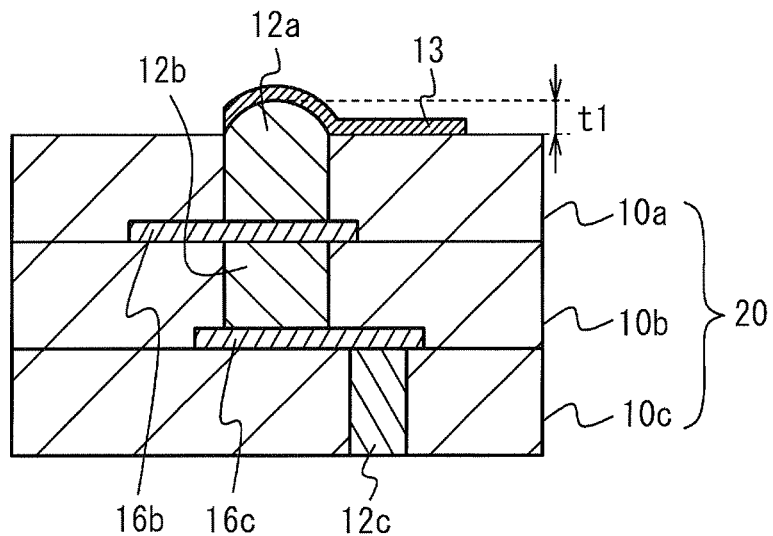
FIG. 6 illustrates the method for manufacturing the stack ceramic substrate.

As shown in FIG. 6, the stacked sheets 10a through 10c are subjected to firing, so as to form a multilayer ceramic substrate 20. The surface of the multilayer ceramic substrate 20 is polished with the use of loose grains or fixed grains, so that the multilayer ceramic substrate 20 has a desired thickness and desired surface roughness. Since the sheets 10a through 10c contract at the time of firing, the upper face of the penetration electrode 12a protrudes. The penetration electrode 12a is not easily polished, while the sheet 10a is easily polished. As a result, the penetration electrode 12a becomes more protrusive. In this manner, the upper face of the penetration electrode 12a is located higher than the upper face of the multilayer ceramic substrate 20. The protruding amount t1 of the penetration electrode 12a with respect to the surface of the sheet 10a is approximately in the range of 0.5 μm to 10 μm, for example.

Figure 7:
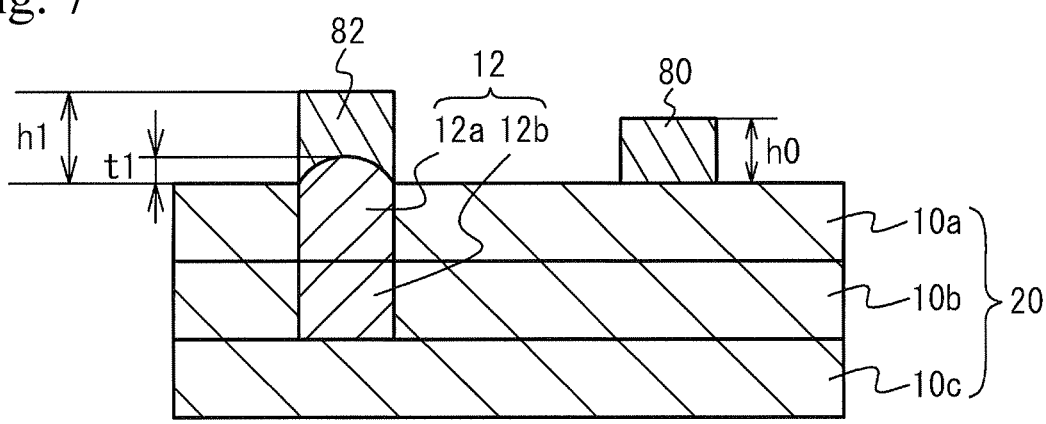
FIG. 7 illustrates the problems of an integrated passive device in accordance with a comparative example.

In a case where a chip is flip-chip mounted onto the multilayer ceramic substrate 20 having a passive device formed on its upper face, a connecting terminal having a greater height than the passive device is used for the flip-chip mounting. Referring now to FIG. 7, the problems observed in a case where connecting terminals are formed on the multilayer ceramic substrate are described. As shown in FIG. 7, the height of a connecting terminal 82 made of a metal such as Cu formed on the penetration electrode 12 of the multilayer ceramic substrate 20 is h1, and the height of a connecting terminal 80 formed in a region other than the upper face of the penetration electrode 12 is h0. The height h1 is greater than the height h0 by almost the protruding amount t1 of the upper face of the penetration electrode 12 with respect to the upper face of the multilayer ceramic substrate 20.

In a case where a chip is flip-chip mounted to the connecting terminals 80 and 82, however, the difference in height between the connecting terminals 80 and 82 is expected to be small. For example, it is preferable that the difference in height between the connecting terminals 80 and 82 is several micron meters or smaller. As shown in FIG. 7, if the heights h0 and h1 of the connecting terminals 80 and 82 differ from each other, the structure is not suitable for flip-chip mounting.

Figure 8:
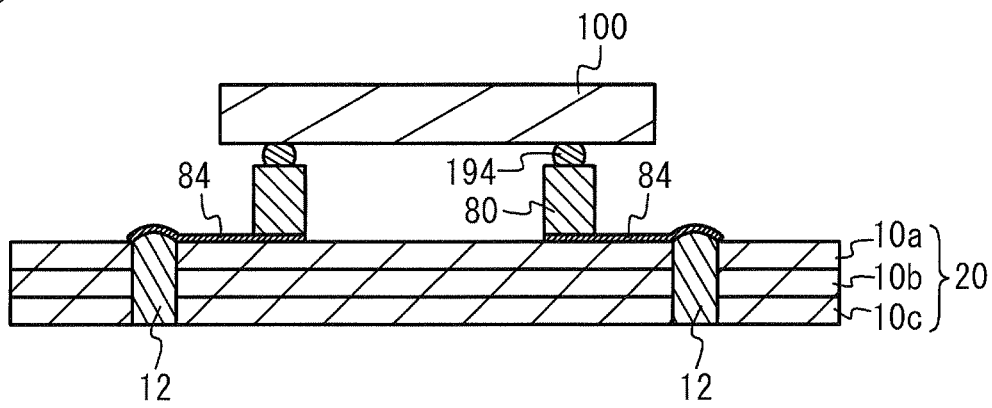
FIG. 8 illustrates the problems of the integrated passive device in accordance with the comparative example.

To counter this problem, the connecting terminal 80 is not formed on the penetration electrode 12, but is formed in a region other than the upper face of the penetration electrode 12, as shown in FIG. 8. The penetration electrode 12 and the connecting terminal 80 are electrically connected by a wire 84. In this manner, the differences in height among the connecting terminals 80 can be made smaller, and higher coplanarity can be achieved. However, it is difficult to form small-sized substrates, as the connecting terminals 80 are not formed on the penetration electrodes 12.

Figure 9:
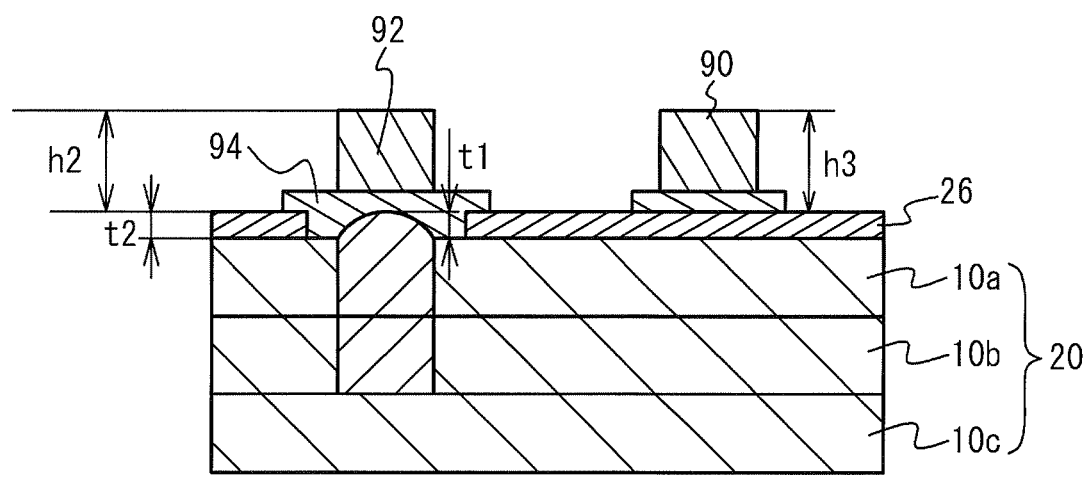
FIG. 9 is a view for explaining the principles of the present invention.

The principles of the present invention to solve the above problems are now described. FIG. 9 is a cross-sectional view for explaining the principles of the present invention. As shown in FIG. 9, an insulating film 26 is provided on the multilayer ceramic substrate 20. The insulating film 26 has an opening formed above the penetration electrode 12. A metal layer 94 is provided on the insulating film 26, so as to cover the opening. A first connecting terminal 92 is provided on the metal layer 94 above the penetration electrode 12, and is electrically connected to the penetration electrode 12. A second connecting terminal 90 is provided on a region of the insulating film 26 other than the region corresponding to the opening. The protruding amount t1 of the penetration electrode 12 is made almost equal to the film thickness t2 of the insulating film 26, so that the height h2 of the first connecting terminal 92 can be made almost equal to the height h3 of the second connecting terminal 90. Further, a protection film 22 described later in the first embodiment may be provided between the metal layer 94 and the penetration electrode 12, and the protection film 22 serves as a barrier layer for preventing interdiffusion between the penetration electrode 12 and the metal layer 94.

First Embodiment

Figure 10A:
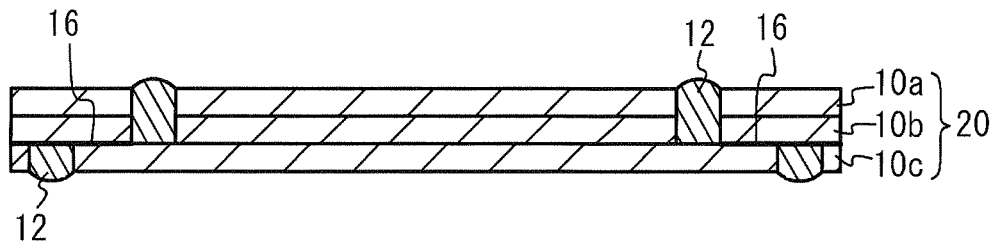
FIGS. 10A through 10D are cross-sectional views illustrating a method for manufacturing an integrated passive device in accordance with a first embodiment of the present invention.

Referring now to FIGS. 10A through 12D, a method for manufacturing an integrated passive device in accordance with a first embodiment of the present invention is described. As shown in FIG. 10A, the multilayer ceramic substrate 20 is formed by the method described with reference to FIGS. 1A through 6. The multilayer ceramic substrate 20 has penetration electrodes 12 and internal wires 16 provided therein. The internal wires 16 are formed between the layers of the multilayer ceramic substrate 20. The upper face of each of the penetration electrodes 12 protrudes from the multilayer ceramic substrate 20.

Figure 10B:
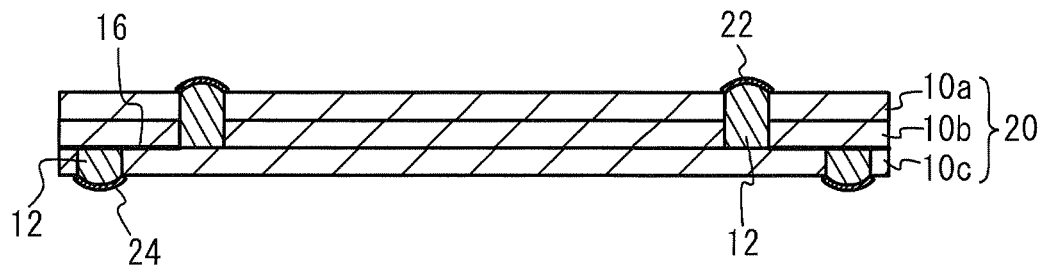

As shown in FIG. 10B, protection films 22 and 24 each including a Ni film of 1 μm to 3 μm in film thickness and an Au film of 0.1 μm to 3 μm in film thickness in this order from the side of the multilayer ceramic substrate 20 are formed on the surfaces of the penetration electrodes 12 by an electroless plating technique. A Pd film of 0.1 μm to 0.3 μm in film thickness may be provided between the Au film and Ni film of each of the protection films 22 and 24. The protection films 22 and 24 function to protect the surfaces of the penetration electrodes 12, and prevent interdiffusion of atoms between the connecting terminals and the penetration electrodes 12. Alternatively, each of the protection films 22 and 24 may be formed by stacking a Ti film, a TiW film, and a Cu film in this order from the bottom, and may be then patterned by a milling technique or the like. The protection films 22 and 24 defined by the penetration electrodes 12 are provided, so that the protruding amount of each of the upper faces of the protection films 22 and 24 with respect to the upper face of the multilayer ceramic substrate 20 becomes even larger.

Figure 10C:
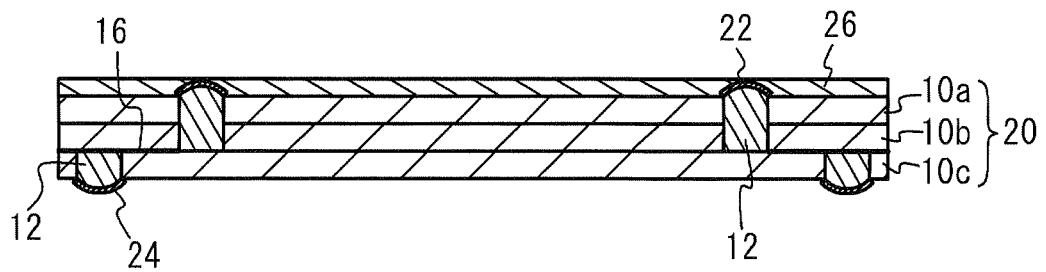
Figure 10D:
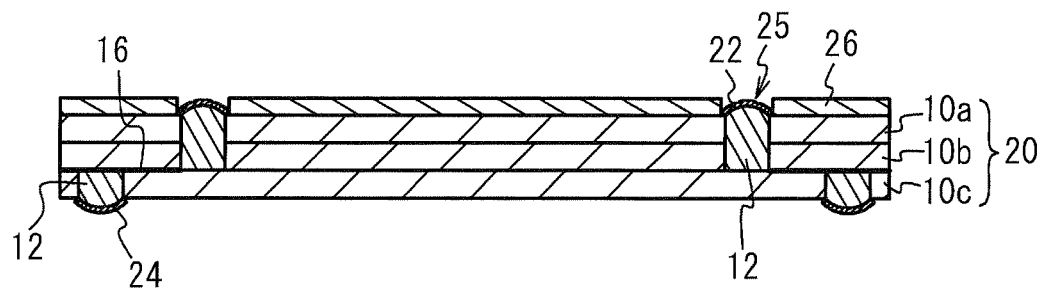

As shown in FIG. 10C, spin coating with the use of photosensitive SOG (spin on glass) to be the insulating film 26 is performed on the upper face of the multilayer ceramic substrate 20. The photosensitive SOG may be Sliecs XC 800, for example. The spin coating is performed where the number of revolutions is controlled by adjusting the protruding amount of each penetration electrode 12, so that the upper face of the insulating film 26 becomes flat throughout the areas of the penetration electrodes and the other areas. The formation of the insulating film 26 may be carried out by an immersion technique or the like, other than the spin coating technique. It is preferable that the film thickness of the insulating film 26 is equal to or slightly greater than the protruding amount of each penetration electrode 12. The spin coating may be performed several times, so as to obtain a desired film thickness for the SOG film. A heat treatment is carried out at 120° C., for example. As shown in FIG. 10D, exposure and development are performed to form openings 25 in the insulating film 26 above the penetration electrodes 12. Curing is preformed at 250° C., for example. In this manner, a SOG oxide film is formed as the insulating film 26.

Figure 11A:
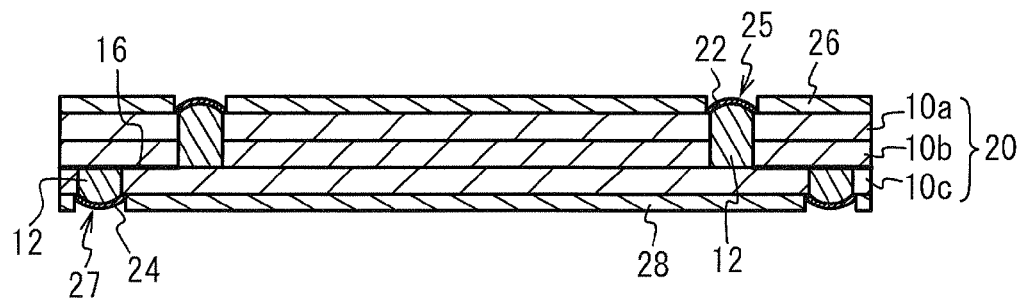
FIGS. 11A through 11C are cross-sectional views illustrating the method for manufacturing the integrated passive device in accordance with the first embodiment.
Figure 11B:
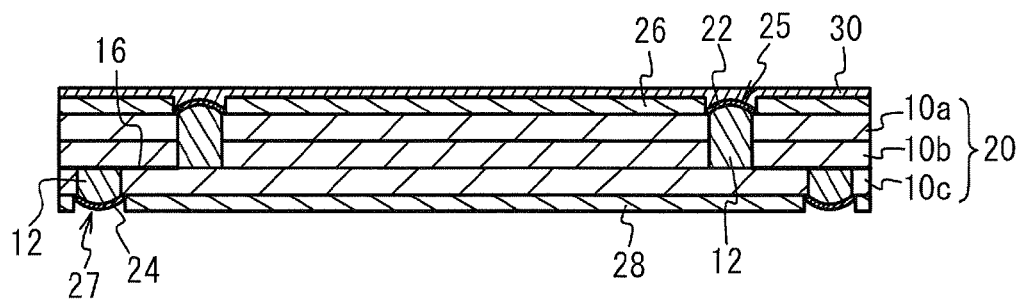
Figure 11C:
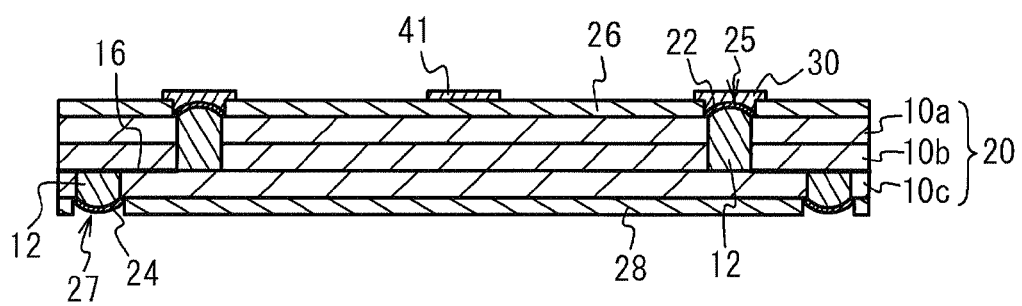

As shown in FIG. 11A, photosensitive SOG to be an insulating film 28 is applied onto the bottom face of the multilayer ceramic substrate 20 in the same manner as in FIG. 10C. Openings 27 are formed in the insulating film 28 in the same manner as in FIG. 10D. As shown in FIG. 11B, a metal layer 30 is formed on the insulating film 26. The metal layer is formed with a 20-nm thick Ti film, a 1000-nm thick Au film, and a 20-nm thick Ti film, for example. The Au film may be replaced with a Cu film. Alternatively, the metal layer 30 may be formed with a 20-nm thick Ti film, an 800-nm thick Cu film, a 200-nm thick Ti film, and a 20-nm thick Au film in this order from the bottom. To reduce the electric resistance, it is preferable that the metal layer 30 includes an Al film, an Au film, and a Cu film as principal components. As shown in FIG. 11C, predetermined regions of the metal layer 30 are removed by an ion milling technique, for example. In this manner, a capacitor lower electrode 41 is formed from the metal layer 30.

Figure 12A:
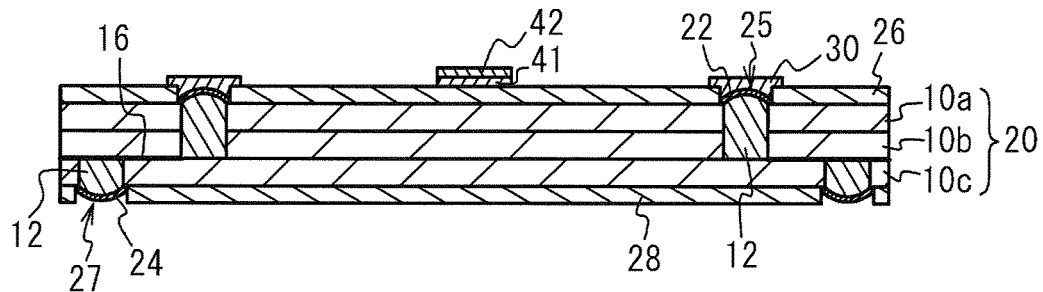
FIGS. 12A through 12D are cross-sectional views illustrating the method for manufacturing the integrated passive device in accordance with the first embodiment.

As shown in FIG. 12A, a dielectric film 42 is formed on the lower electrode 41. The dielectric film 42 may be formed by a sputtering technique or PECVD (Plasma Enhanced Chemical Vapor Deposition), for example, and may be a $SiO_2$ film, a $Si_3N_4$ film, an $Al_2O_3$ film, or a $Ta_2O_3$ film. The film thickness of the dielectric film 42 is in the range of 50 nm to 1000 nm, for example.

Figure 12B:
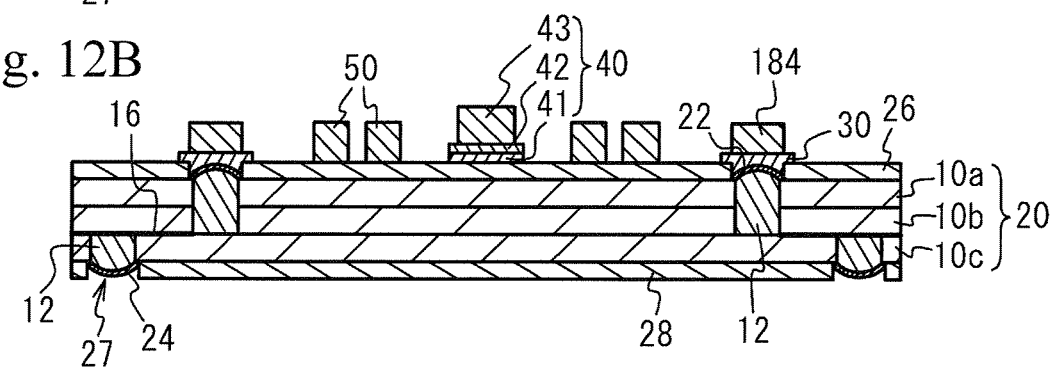

As shown in FIG. 12B, a seed layer (not shown) including a 20-nm thick Cr film and a 500-nm thick Au film is formed on the insulating film 26 and the metal layer 30. A 10-μm thick plating layer 184 made of Cu is formed on each predetermined region of the seed layer by an electrolytic plating technique, for example. With the plating layers 184 serving as masks, the sheet layer is removed to form an upper electrode 43 from the plating layers 184. The lower electrode 41, the dielectric film 42, and the upper electrode 43 constitute a capacitor 40. The plating layers 184 form the coils of inductors 50. Further, the plating layers 184 form the lower layers of connecting terminals.

Figure 12C:
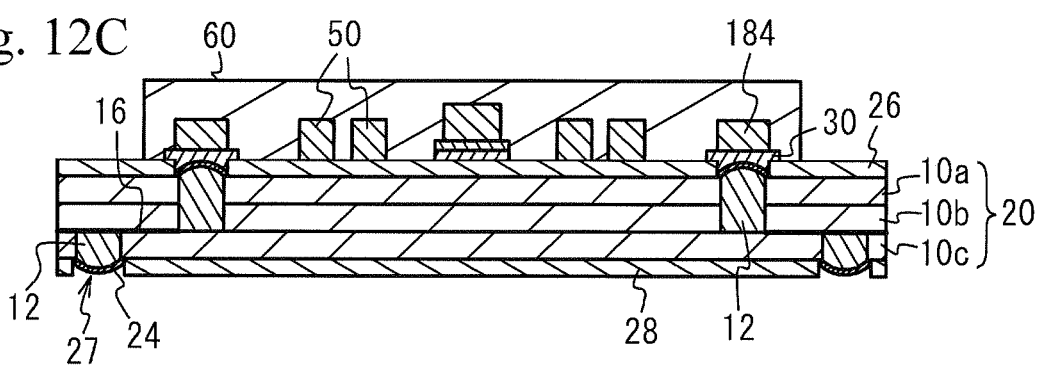

As shown in FIG. 12C, a low-dielectric film 60 is formed on the multilayer ceramic substrate 20, so as to cover the plating layers 184. The low-dielectric film 60 may be a PBO (polybenzoxazole) film, a BCB (benzocyclobutene) film, or the like.

Figure 12D:
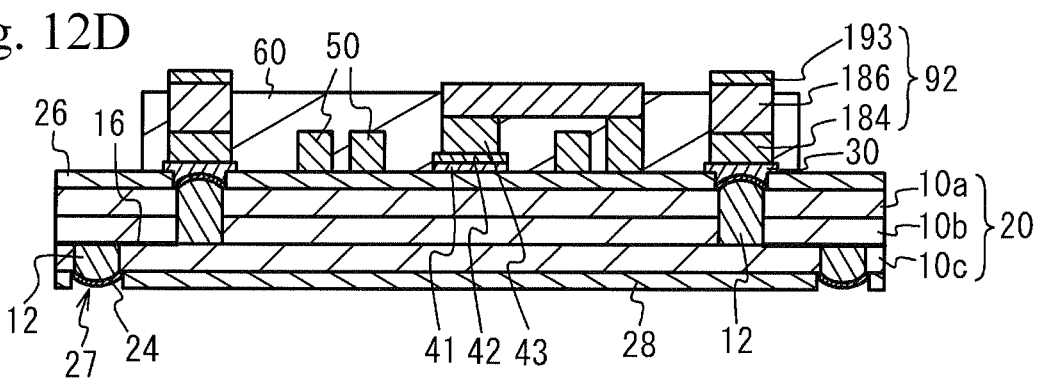

As shown in FIG. 12D, predetermined regions of the low-dielectric film 60 are removed to expose the upper faces of the plating layers 184 on which upper plating layers are to be formed. Plating layers 186 that are 10 μm in thickness and are made of Cu are formed in contact with the plating layers 184 by an electrolytic plating technique, for example. When the plating layers 186 are formed, a seed layer is used in the same manner as in FIG. 12A, but explanation of it is omitted here. A pad layer 193 including an Au film and a Ni film is formed on each of the plating layers 186, for example. As a result, a first connecting terminal 92 including the metal layer 30, the plating layers 184 and 186, and the pad layer 193 is formed on each of the penetration electrodes 12. Thus, an integrated passive device including the multilayer ceramic substrate 20 is completed.

Figure 13:
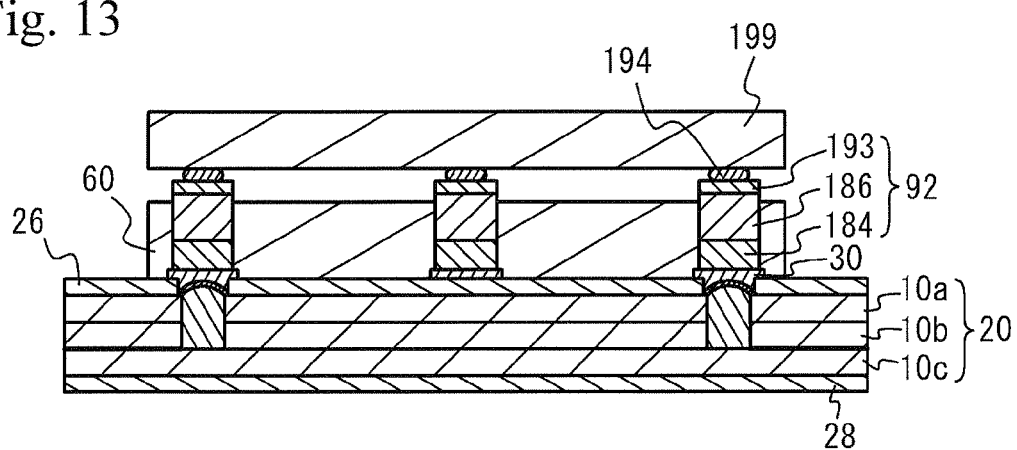
FIG. 13 is a view of a structure having a chip mounted on the integrated passive device in accordance with the first embodiment.

FIG. 13 is a cross-sectional view of a structure in which a chip is flip-chip mounted on the integrated passive device, and is different from any of the cross-sectional views of FIGS. 12A through 12D. Passive elements such as capacitors and inductors are not shown in FIG. 13. As shown in FIG. 13, a second connecting terminal 90 is provided in a region other than the regions of the penetration electrodes 12. Bumps 194 that are made of solder or a metal such as Au are formed on the first connecting terminals 92 and the second connecting terminal 90. With the use of the bumps 194, a chip 199 having an electronic device such as a surface acoustic wave filter formed therein is flip-chip mounted onto the first connecting terminal 92 and the second connecting terminal 90. In this manner, an electronic component in accordance with the first embodiment is completed.

In accordance with the first embodiment, the multilayer ceramic substrate 20 includes the penetration electrodes 12 as shown in FIG. 13, and has the capacitor 40 and the inductors 50 as passive elements provided on its upper face (see FIG. 12D). Accordingly, the chip 199 is flip-chip mounted onto the connecting terminals that are located higher than the passive elements such as the capacitor 40 and the inductors 50. The insulating film 26 having openings above the penetration electrodes 12 is placed on the multilayer ceramic substrate 20. The first connecting terminals 92 are placed above the insulating film 26, so as to cover the openings. The first connecting terminals 92 are electrically connected to the penetration electrodes 12. Meanwhile, the second connecting terminal 90 is placed on a region of the insulating film, other than the regions corresponding to the openings. With the insulating film 26 being formed in this manner, the heights of the first connecting terminals 92 and the second connecting terminal 90 are made almost the same. With this arrangement, peel-off of the chip 199 or the like due to degradation of the coplanarity of the connecting terminals 92 and 90 can be prevented. Accordingly, the first connecting terminals 92 can be formed above the penetration electrodes 12, and the multilayer ceramic substrate 20 can be made smaller than the example structure shown in FIG. 8.

Also, as shown in FIG. 10B, the protection films 22 to protect the penetration electrodes 12 are provided on the penetration electrodes 12, and the first connecting terminals 92 are placed on the protection films 22, as shown in FIG. 13.

The protection films 22 are selectively formed on the penetration electrodes 12. In other words, the protection films 22 are defined by the penetration electrodes 12. With this arrangement, the upper faces of the protection films 22 protrude further. Accordingly, using the insulating film 26 is more advantageous.

Further, as shown in FIG. 12D, passive elements such as the capacitor 40 and the inductors 50 are placed on the insulating film 26. As the insulating film 26 is made of a material with a lower dielectric constant than the dielectric constant of the multilayer ceramic substrate 20, loss of the passive elements can be made smaller.

It is preferable that the insulating film 26 is a SOG oxide film formed with SOG. The relative permittivity of the film formed with SOG is approximately in the range of 2.5 to 4, and the relative permittivity of the multilayer ceramic substrate 20 is approximately in the range of 7 to 12. Accordingly, loss of the passive elements can be made smaller. The film formed with SOG also has high heat resistance. When the passive elements shown in FIGS. 12A through 12D are formed, the temperature is in the range of 200° C. to 300° C. For example, if a resin material such as BCB is used, there is a restriction on the method for forming passive elements on the multilayer ceramic substrate 20, since such a resin does not have high heat resistance. In accordance with the first embodiment, however, the insulating film 26 is a film formed with SOG. Thus, passive elements can be more easily formed.

Furthermore, it is preferable to use a photosensitive SOG oxide film as the insulating film 26. By doing so, the openings 25 can be readily formed in the insulating film 26.

Second Embodiment

Figure 14A:
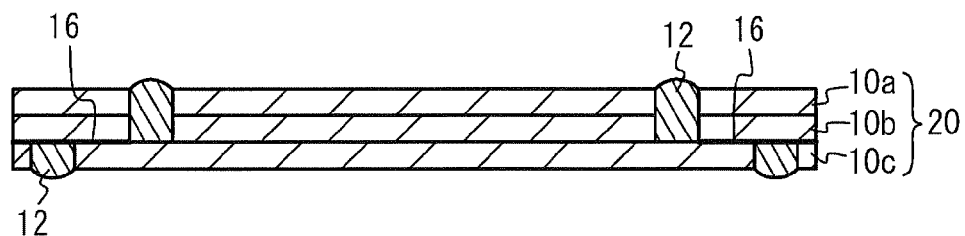
FIGS. 14A through 14C are cross-sectional views illustrating a method for manufacturing an integrated passive device in accordance with a second embodiment of the present invention.
Figure 14B:
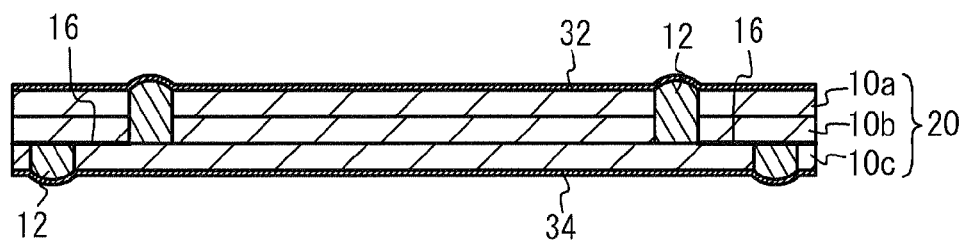
Figure 14C:
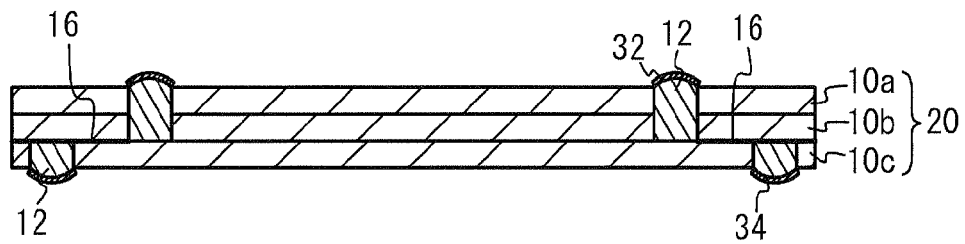

A second embodiment of the present invention is an example without a photosensitive SOG oxide film. Referring to FIGS. 14A through 15C, a method for manufacturing a multilayer ceramic substrate of the second embodiment is described. As shown in FIG. 14A, the same multilayer ceramic substrate 20 as that of the first embodiment shown in FIG. 10A is prepared. As shown in FIG. 14B, protection films 32 and 34 are formed on the upper face and the lower face of the multilayer ceramic substrate 20 by a sputtering technique. Each of the protection films 32 and 34 may include a Ti film having a film thickness in the range of 0.1 μm to 0.5 μm and a TiW film having a film thickness in the range of 0.5 μm to 3 μm from the side of the multilayer ceramic substrate 20, for example. It is also possible to form a Cu film having a film thickness in the range of 0.3 μm to 3 μm on the Ti film. Alternatively, each of the protection films 32 and 34 may include a Ti film having a film thickness in the range of 0.1 μm to 0.5 μm and an Au film having a film thickness in the range of 0.5 μm to 3 μm, for example. As shown in FIG. 14C, predetermined regions of the protection films 32 and 34 are removed, so that the portions of the protection films 32 and 34 above the penetration electrodes 12 remain. It is preferable that the protection films 32 and 34 are larger than the upper faces of the penetration electrodes 12, and completely cover the upper faces of the penetration electrodes 12.

Figure 15A:
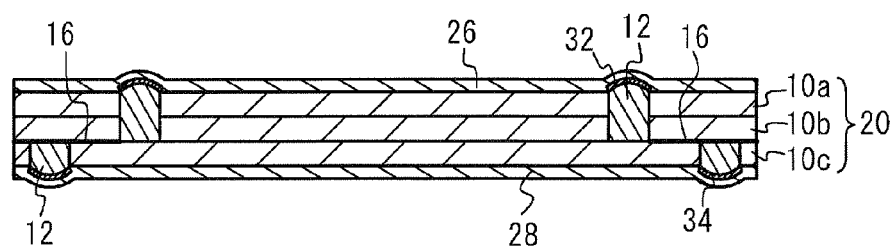
FIGS. 15A through 15C are cross-sectional views illustrating the method for manufacturing the integrated passive device in accordance with the second embodiment.
Figure 15B:
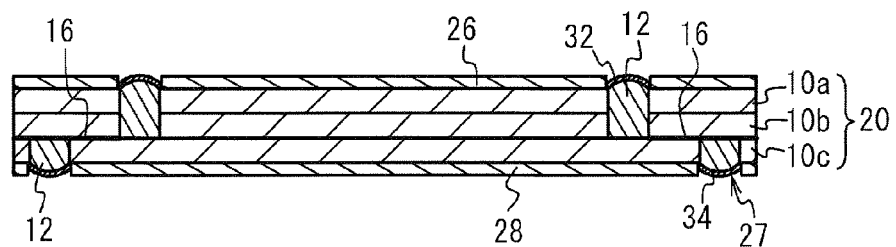
Figure 15C:
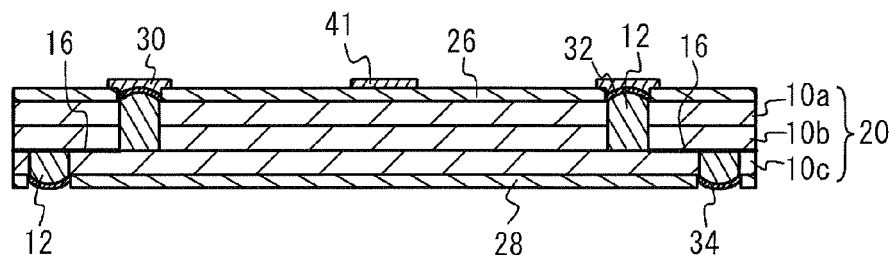

As shown in FIG. 15A, SOG is applied onto the upper face and the lower face of the multilayer ceramic substrate 20, so as to form insulating films 26 and 28 that cover the penetration electrodes 12 and the protection films 32 and 34. The SOG may be LNT-025, produced by Catalysts and Chemicals Industries Co., Ltd., for example. After that, curing is performed on the insulating films 26 and 28 at 400° C., for example. As shown in FIG. 15B, the insulating films 26 and 28 on the penetration electrodes 12 are removed with hydrofluoric acid. As shown in FIG. 15C, the same procedures as those of the first embodiment illustrated in FIGS. 11B and 11C are carried out to form the metal layer 30 on the insulating film 26. After that, the same procedures as those of the first embodiment illustrated in FIGS. 12A through 12D are carried out to complete the integrated passive device of the second embodiment.

As in the second embodiment, non-photosensitive SOG can be used as the insulating films 26 and 28.

Third Embodiment

Figure 16:
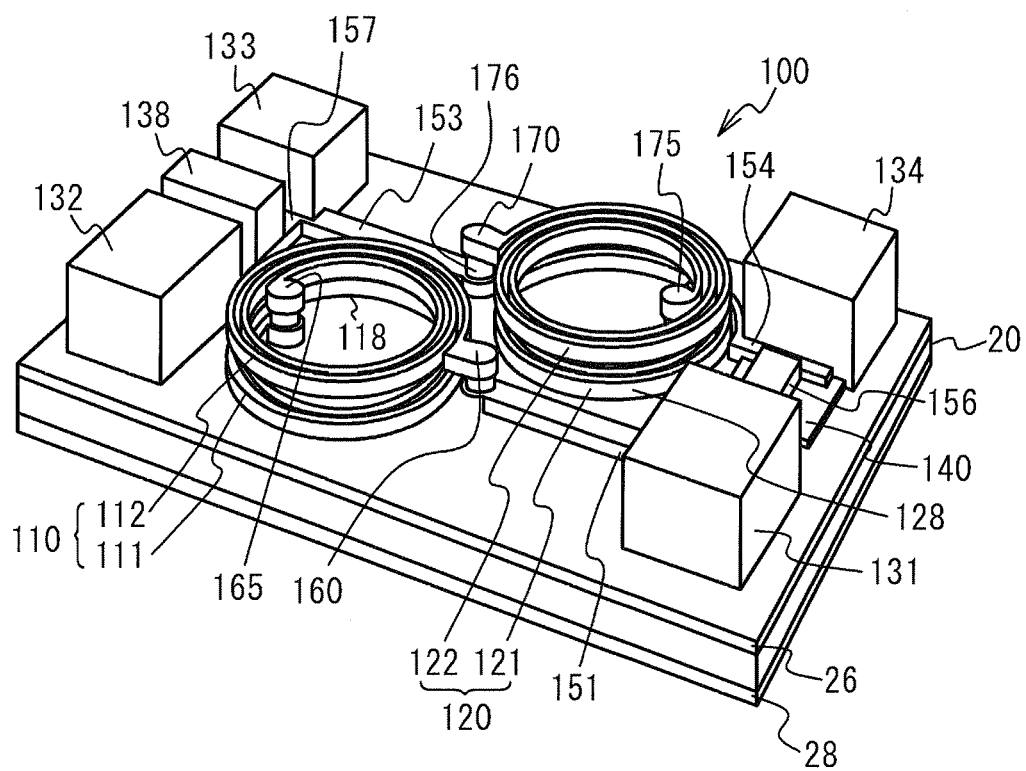
FIG. 16 is a perspective view of an integrated passive device in accordance with a third embodiment of the present invention.
Figure 17:
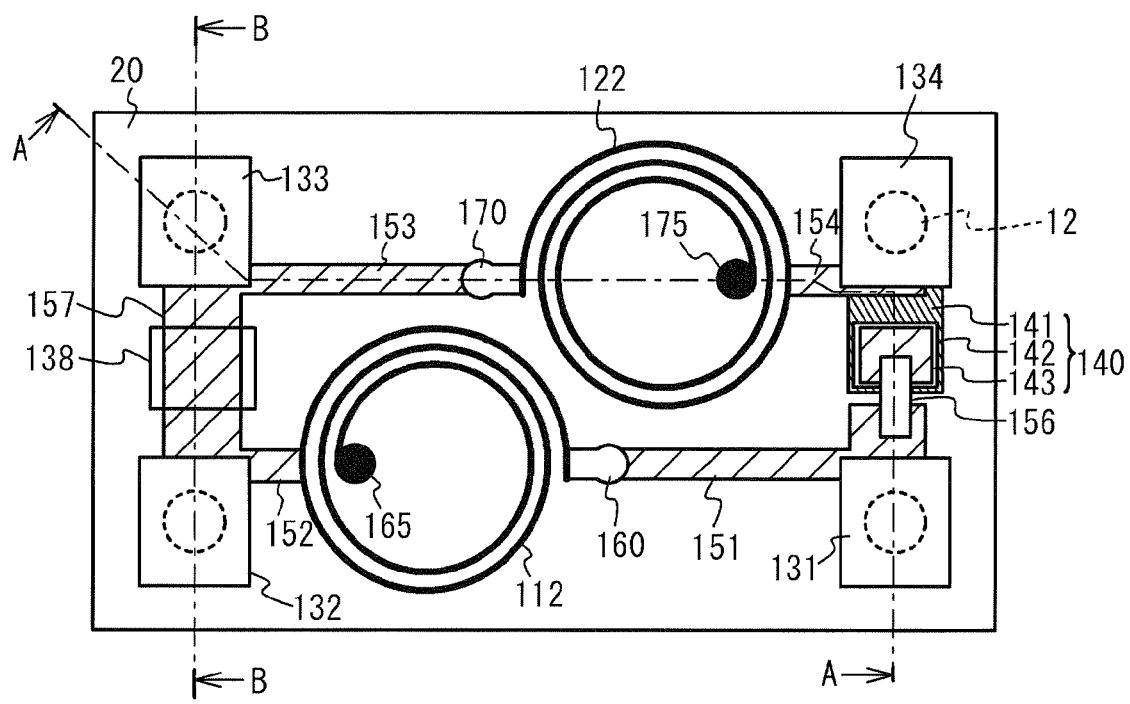
FIG. 17 is a top view of the integrated passive device in accordance with the third embodiment.

A third embodiment of the present invention is an example that involves inductors each having two coils stacked with a space formed in between. FIG. 16 is a perspective view of an integrated passive device in accordance with the third embodiment. FIG. 17 is a top view of the integrated passive device (though first coils 111 and 121 are not shown). As shown in FIGS. 16 and 17, an inductor 110 that includes a first coil 111 and a second coil 112, and an inductor 120 that includes a first coil 121 and a second coil 122 are formed on the insulating film 26 above the multilayer ceramic substrate 20. The inner ends (the ends of the innermost peripheries) of the first coil 111 and the second coil 112 of the inductor 110 are electrically connected to each other by a connecting unit 165. The first coil 111 is connected to a wire 152 at its outer end (the end of its outermost periphery). The second coil 112 is electrically connected to a wire 151 at its outer end via a connecting unit 160.

The inner ends of the first coil 121 and the second coil 122 of the inductor 120 are connected to each other by a connecting unit 175. The first coil 121 is connected to a wire 154 at its outer end. The second coil 122 is connected to a wire 153 via a connecting unit 170 at its outer end. The wires 151 through 154 are formed on the insulating film 26 above the multilayer ceramic substrate 20, and are connected to first connecting terminals 131 through 134. The first connecting terminals 132 and 133 are connected by a wire 157. A second connecting terminal 138 is provided on the wire 157 between the first connecting terminals 132 and 133. A capacitor 140 formed with a lower electrode 141, a dielectric film 142, and an upper electrode 143 is connected between the first connecting terminals 131 and 134. The upper electrode 143 and the wire 151 are connected by a wire 156 located thereon. The first connecting terminal 131 is connected to the input end, the first connecting terminal 134 is connected to the output end, and the first connecting terminals 132 and 133 are grounded. With this arrangement, an integrated passive device 100 forms a π-type L-C-L circuit between the first connecting terminals 131 and 134.

Referring now to FIGS. 18A through 18D, a method for manufacturing the integrated passive device in accordance with the third embodiment is described. FIGS. 18A through 18D are schematic cross-sectional views, taken along the line A-A of FIG. 17. Although FIGS. 18A through 18D show second connecting terminals 198 for reinforcing the mechanical connection between a chip and the multilayer ceramic substrate 20, FIGS. 16 and 17 do not show the second connecting terminals 198.

Figure 18A:
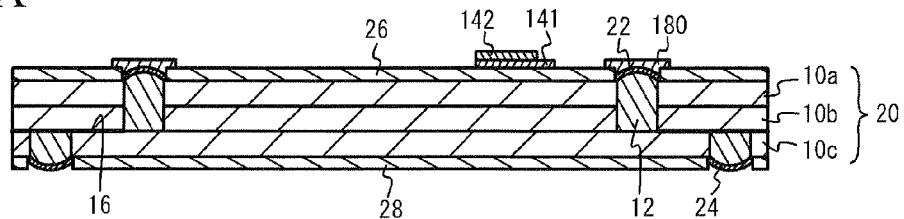
FIGS. 18A through 18D are cross-sectional views illustrating a method for manufacturing the integrated passive device in accordance with the third embodiment.

As shown in FIG. 18A, the procedures of the first embodiment illustrated in FIGS. 10A through 11C are carried out. The metal layer 30 is shown as a metal layer 180, and the lower electrode 41 of the capacitor is shown as the lower electrode 141. The dielectric film 142 for the capacitor is formed in the same manner as in FIG. 12A.

Figure 18B:
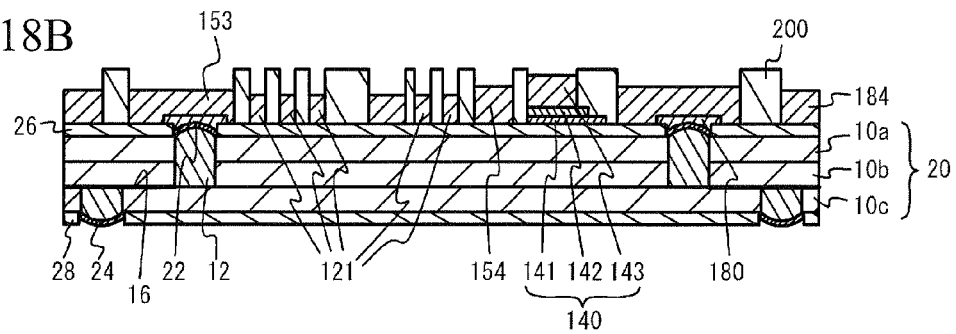

As shown in FIG. 18B, a seed layer (not shown) for electrolytic plating is formed. A photoresist 200 having openings for plating is formed. Electrolytic plating is performed inside the openings, so as to form 10-µm thick plating layers 184 made of Cu, for example. In this manner, the first coil 121, the upper electrode 143, the wires 153 and 154, and the lower portions of the first connecting terminals are formed from the plating layers 184. The lower electrode 141, the dielectric film 142, and the upper electrode 143 form the MIM capacitor 140.

Figure 18C:
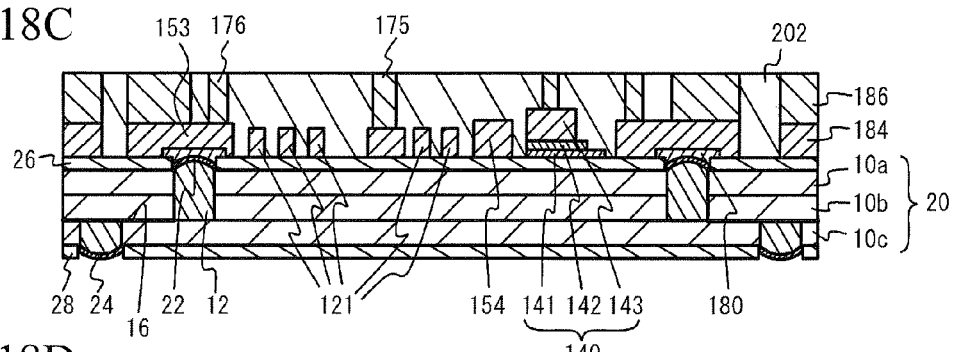

As shown in FIG. 18C, the photoresist 200 is removed. A photoresist 202 having openings for plating is then formed. Electrolytic plating is performed inside the openings, so as to form 10-µm thick plating layers 186 made of Cu, for example. In this manner, support pillars 174 and 176 and the intermediate portions of the first connecting terminals are formed from the plating layers 186.

Figure 18D:
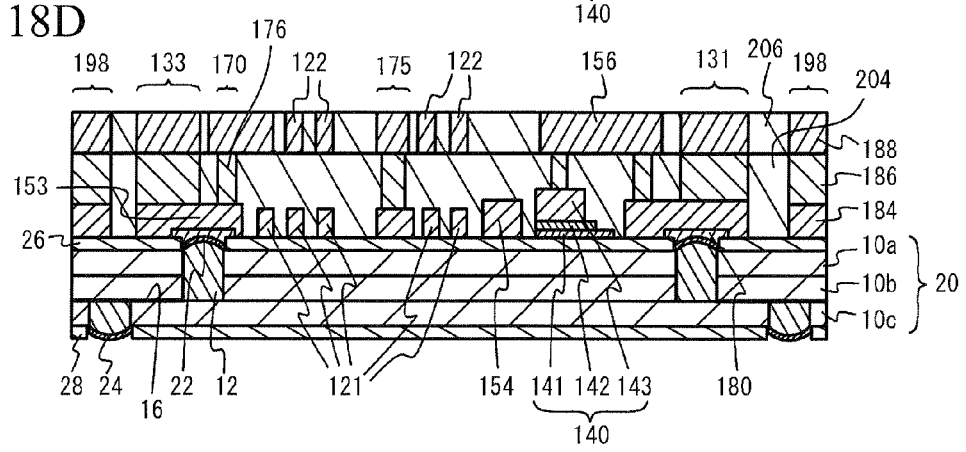

As shown in FIG. 18D, the photoresist 202 is removed. A sacrifice layer 204 made of a photoresist is then applied onto the structure, for example. The upper face of the sacrifice layer 204 is substantially level with the upper faces of the support pillars 174 and 176. A seed layer (not shown) for electrolytic plating is then formed on the entire surface of the sacrifice layer 204. A photoresist 206 having openings for plating is formed on the seed layer. Electrolytic plating is then performed inside the openings, so as to form 10-µm thick plating layers 188 made of Cu, for example. In this manner, the second coil 122, the wire 156, and the upper portions of the pads are formed from the plating layers 188. The plating layers 184, 186, and 188 form the connecting unit 170 and the connecting unit 175.

Figure 19A:
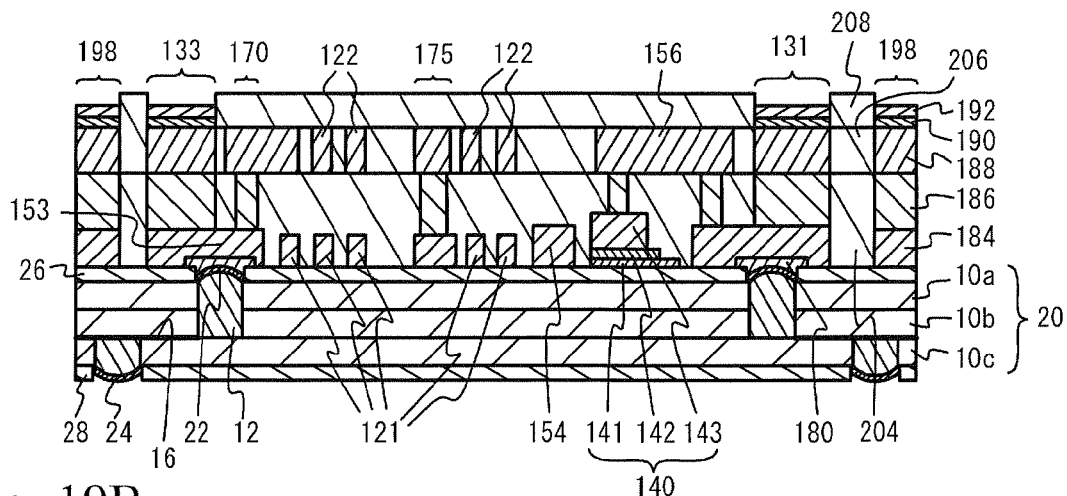
FIGS. 19A through 19C are cross-sectional views illustrating the method for manufacturing the integrated passive device in accordance with the third embodiment.
Figure 19B:
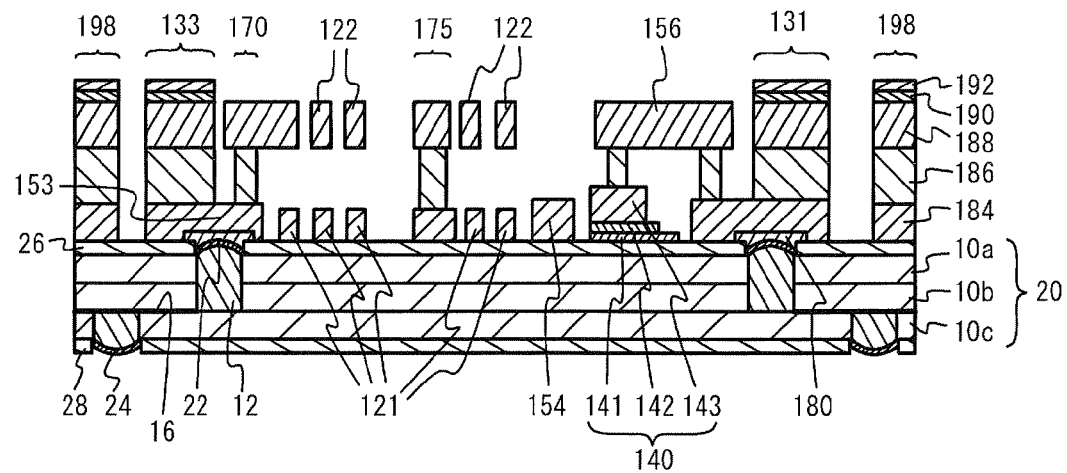

As shown in FIG. 19A, a photoresist 208 having openings is formed. Ni layers 190 and Au layer 192 are formed on the plating layers 188. As shown in FIG. 19B, the photoresist 208, the seed layer (not shown), the photoresist 206, and the sacrifice layer 204 are removed. The metal layer 180, the plating layers 184, 186, and 188, the Ni layers 190, and the Au layers 192 form the first connecting terminals 131 and 133 and the second connecting terminals 198. In this manner, the integrated passive device in accordance with the third embodiment is formed.

Figure 19C:
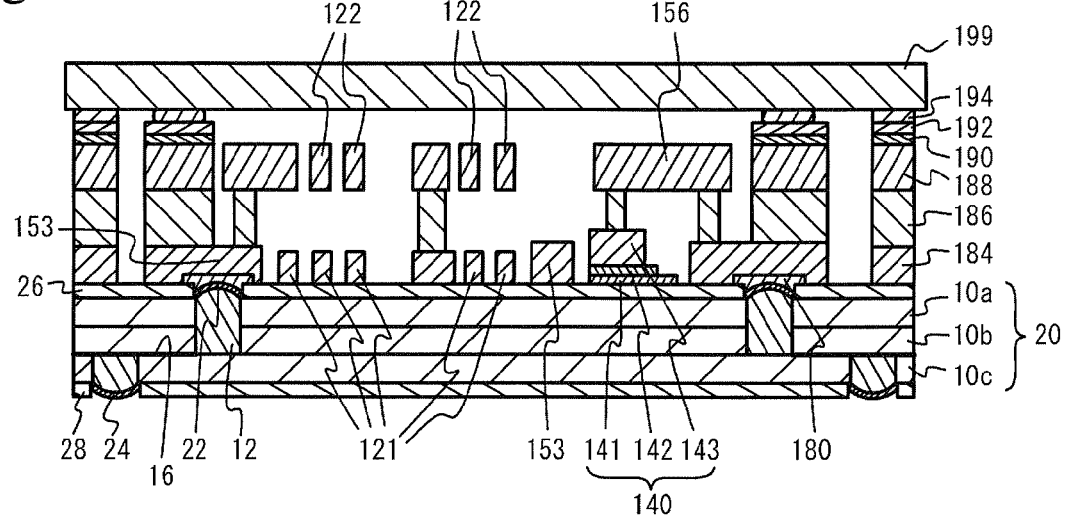

Referring now to FIG. 19C, the mounting of the chip 199 is described. As shown in FIG. 19C, the chip 199 is flip-chip mounted onto the first connecting terminals 131 and 133 and the second connecting terminals 198 with the bumps 194.

Figure 20:
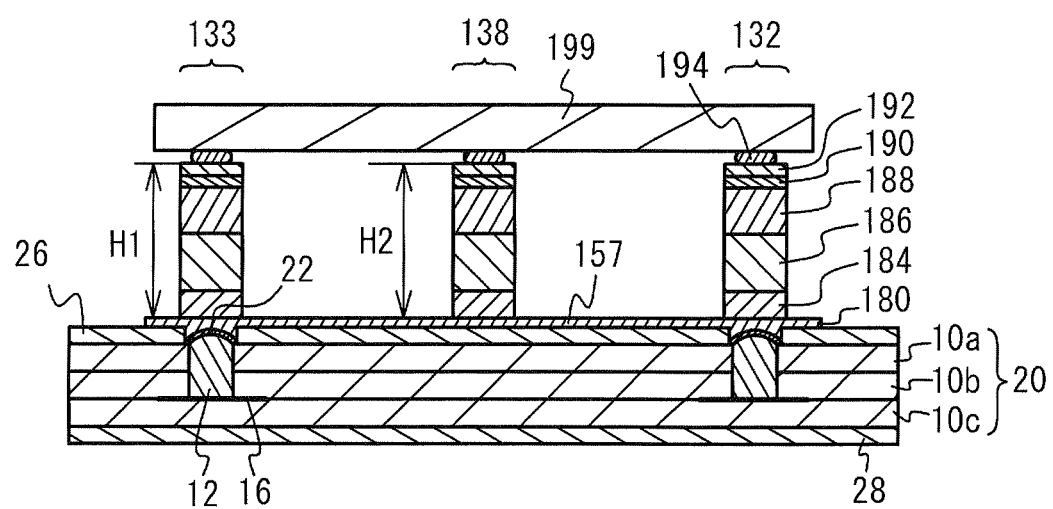
FIG. 20 is a view of a structure having a chip mounted on the integrated passive device in accordance with the third embodiment.

FIG. 20 is a cross-sectional view of the integrated passive device of the third embodiment in which the chip 199 such as an IC or SAW (surface acoustic wave) device is flip-chip mounted, taken along the line B-B of FIG. 17. As shown in FIG. 20, since the insulating film 26 having openings above the penetration electrodes 12 is also provided in the third embodiment, the height H1 of each of the first connecting terminals 132 and 133 can be made almost equal to the height H2 of the second connecting terminal 138. With this arrangement, a small-sized integrated passive device can be achieved as in the first embodiment. As shown in FIG. 16, the present invention can be applied to an integrated passive device that has inductors including the spiral-like first coils 111 and 121 provided on the insulating film 26, and the spiral-like second coils 112 and 122 provided above the first coils 111 and 121 at a distance from each other, with a space being kept in between.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. An electronic component comprising:
a multilayer ceramic substrate;
a penetration electrode penetrating an uppermost layer of the multilayer ceramic substrate;
an insulating film that is provided directly on an upper face of the uppermost layer of the multilayer ceramic substrate, and has an opening formed above the penetration electrode and directly on the upper face of the uppermost layer, the insulating film being made of a different material from the uppermost layer, the upper face of the uppermost layer being opposite to a face of the uppermost layer directly jointed to another layer of the multilayer ceramic substrate, the insulating film being a single layer;
a passive element provided on an upper face of the insulating film, the upper face of the insulating film being opposite a face of the insulating film directly jointed to the upper face of the uppermost layer;
a first connecting terminal that is provided on the upper face of the insulating film so as to cover the opening, and is electrically connected to the penetration electrode; and
a second connecting terminal that is provided on a region of the upper face of the insulating film, the region being other than the region corresponding to the opening;
wherein an upper face of the penetration electrode is located higher than the upper face of the uppermost layer, a width of the penetration electrode located over the uppermost layer is equal or less than that of the penetration electrode located in the uppermost layer, and the penetration electrode is formed integrally.

2. An electronic component comprising:
a multilayer ceramic substrate;
a penetration electrode penetrating an uppermost layer of the multilayer ceramic substrate;
an insulating film that is provided directly on an upper face of the uppermost layer of the multilayer ceramic substrate, and has an opening formed above the penetration electrode and directly on the upper face of the uppermost layer, the insulating film being made of a different material from the uppermost layer, the upper face of the uppermost layer being opposite to a face of the uppermost layer directly jointed to another layer of the multilayer ceramic substrate, the insulating film being a single layer;
a passive element provided on an upper face of the insulating film, the upper face of the insulating film being opposite a face of the insulating film directly jointed to the upper face of the uppermost layer;
a first connecting terminal that is provided on the upper face of the insulating film so as to cover the opening, and is electrically connected to the penetration electrode;
a second connecting terminal that is provided on a region of the upper face of the insulating film, the region being other than the region corresponding to the opening;
a first pad that is placed directly on an upper face of the penetration electrode and directly on the upper face of the insulating film and covers a space between the penetration electrode and the insulating film in the opening, an area of the first pad being larger than that of the upper face of the penetration electrode; and
a second pad that is placed directly on a region of the upper face of the insulating film that is other than the opening, wherein:
the first connecting terminal is placed directly on an upper face of the first pad;
the second connecting terminal is placed directly on an upper face of the second pad.

3. The electronic component as claimed in claim 1, wherein the passive element is placed on the insulating film.

4. The electronic component as claimed in claim 1, wherein the first connecting terminal and the second connecting terminal have the same height.

5. The electronic component as claimed in claim 1, wherein the insulating film is a SOG oxide film.

6. The electronic component as claimed in claim 1, wherein the insulating film is a photosensitive SOG oxide film.

7. The electronic component as claimed in claim 1, wherein the first connecting terminal and the second connecting terminal are terminals for flip-chip mounting.

8. The electronic component as claimed in claim 1, wherein:
the passive element is an inductor; and
the inductor includes a spiral-like first coil provided on the insulating film, and a spiral-like second coil provided above the first coil at a distance from each other, with a space being kept in between.

9. The electronic component as claimed in claim 1, further comprising
a chip that is flip-chip mounted onto the first connecting terminal and the second connecting terminal.

10. The electronic component as claimed in claim 1, wherein an area of the opening is larger than that of an upper face of the penetration electrode when viewed from above.

\* \* \* \* \*